United States Patent [19]

Sato

[11] Patent Number: 5,249,726
[45] Date of Patent: Oct. 5, 1993

[54] TAPE CLAMPING MECHANISM
[75] Inventor: Koji Sato, Fussa, Japan
[73] Assignee: Kabushiki Kaisha Shinkawa, Tokyo, Japan
[21] Appl. No.: 913,867
[22] Filed: Jul. 15, 1992
[30] Foreign Application Priority Data Jul. 15, 1991 [JP] Japan .................. 3-198198

[51] Int. Cl.⁵ ............... H01L 21/603; B23K 37/04
[52] U.S. Cl. .................................. 228/6.2; 228/44.7
[58] Field of Search ............ 228/180.2, 212, 213, 228/6.2, 44.7, 47, 49.1; 269/903

[56] References Cited

U.S. PATENT DOCUMENTS 3,516,155  6/1970  Smith ..................... 228/44.7
3,698,618  10/1972  Helda ..................... 228/44.7
5,035,034  7/1991  Cotney ................... 228/44.7
5,108,023  4/1992  Japachino et al. ........... 228/6.2

FOREIGN PATENT DOCUMENTS 2-1372    1/1990  Japan .
2-273949  11/1990  Japan .

Primary Examiner—Samuel M. Heinrich
Attorney, Agent, or Firm—Koda and Androlia

[57] ABSTRACT

A positional alignment of the upper and lower clampers, which hold a tab tape in between during a bonding operation in tape bonding machines, is made with high precision via respective positioning holes formed in vertically corresponding positions in the upper and lower clampers.

3 Claims, 2 Drawing Sheets

TAPE CLAMPING MECHANISM

BACKGROUND OF THE INVENTION

1. Field of the Invention

The present invention relates to a tape clamping mechanism which clamps a tab tape by upper and lower clampers.

2. Prior Art

Tape bonding machines which bond semiconductor pellets, bumps, etc. to a tab tape generally include a tape clamping mechanism which clamps, in a bonding position, a tab tape between upper and lower clampers.

Tape clamping mechanisms of this type are disclosed, for example, in Japanese Patent Application Publication (Kokoku) No. 2-1372 and Japanese Patent Application Laid-Open (Kokai) No. 2-273949.

Conventionally, positional alignment of the upper and lower clampers in such tape clamping mechanisms is accomplished in the following manner: a tab tape is first positioned at a bonding position, the bonding window of an upper clamper is visually aligned with the bonding portion of the tab tape, and then the upper clamper is mounted to an upper clamper holding plate by screws. A bonding window in the lower clamper is next aligned visually with the bonding window of the upper clamper, and then the lower clamper is mounted to a lower clamper holding plate by screws.

In this prior art, since a positional alignment of the bonding window of the upper clamper and the bonding window of the lower clamper is accomplished visually, it requires a considerable length of time. In addition, such an alignment cannot be made with high precision. Furthermore, the position of the lower clamper can shift during the screw-tightening operation.

SUMMARY OF THE INVENTION

Accordingly, the object of the present invention is to provide a tape clamping mechanism which accomplishes a positional alignment of the upper and lower clampers easily and precisely.

The object of the present invention is accomplished by a unique structure wherein both the upper and lower clampers have positioning holes which are provided at vertically corresponding positions.

If the bonding window of the upper (and not the lower) clamper is positionally aligned beforehand with respect to a bonding portion of the tab tape, positioning pins are first inserted into the positioning holes of the upper clamper after loosening the fastening screws of the lower clamper, and the lower clamper is moved so that the positioning holes of the lower clamper are aligned with the positioning holes formed in the lower clamper, and then the positioning pins are inserted into the positioning holes of the lower clamper.

Alternatively, in case the bonding window of the lower (and not the upper) clamper is positionally aligned beforehand with respect to the bonding portion of the tab tape, positioning pins are first inserted into the positioning holes of the upper clamper after loosening screws for the upper clamper, and the upper clamper is moved so that the positioning pins are aligned with the positioning holes of the lower clamper, and then the positioning pins are inserted into the positioning holes of the lower clamper.

With the positioning pins thus inserted into the positioning holes of the upper and lower clampers, the screws for fastening the lower clamper or the screws for fastening the upper clamper are tightened back.

DETAILED DESCRIPTION OF THE INVENTION

Figure 1:
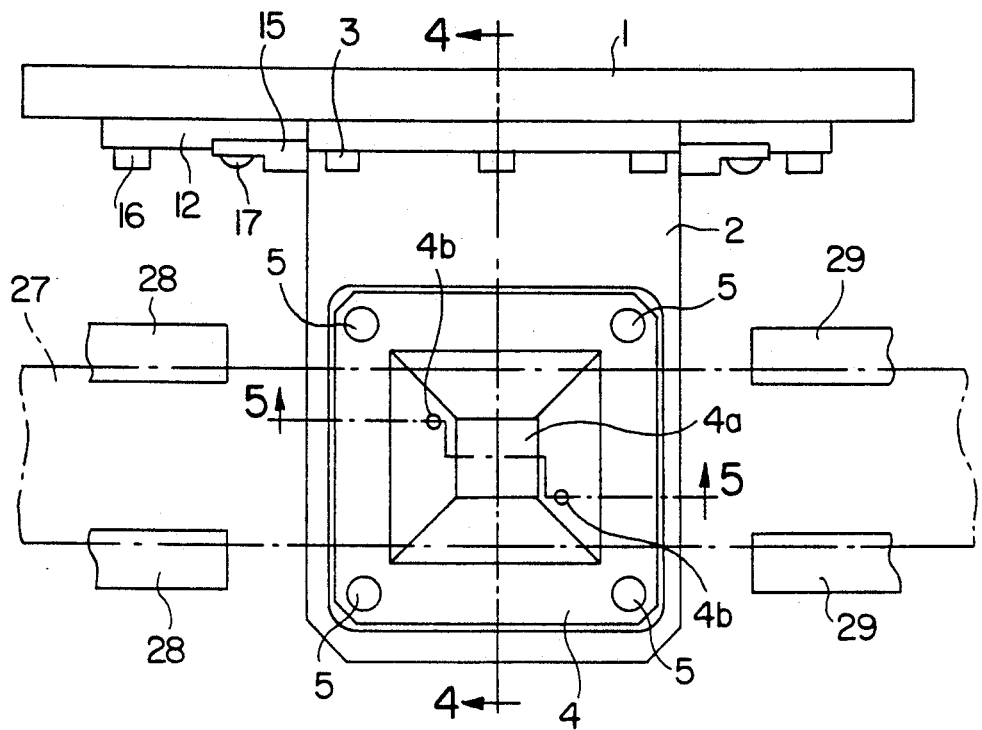
FIG. 1 is a top view of one embodiment of the present invention.
Figure 2:
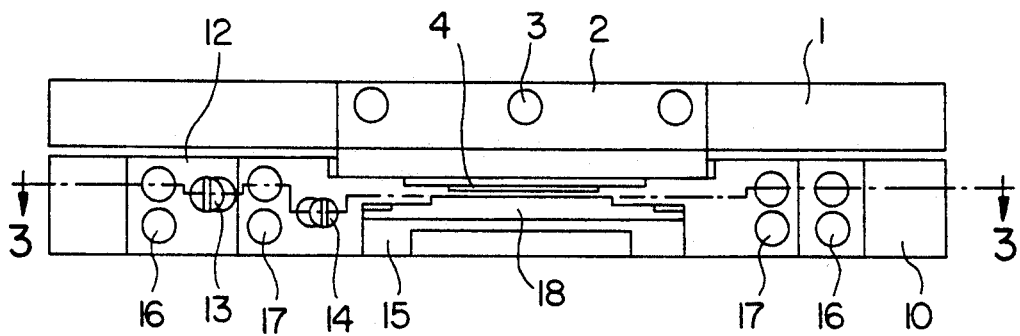
FIG. 2 is a front view thereof.

An upper clamper raising-and-lowering arm (called "upper clamper arm") 1 is moved upward and downward while being kept its horizontal position by a driving means (not shown). The upper clamper arm 1 is provided with an upper clamper holding plate 2 which is fastened to the upper clamper arm 1 via a screw 3.

An upper clamper 4 is fastened to this upper clamper holding plate 2 by screws 5. The upper clamper 4 has a bonding window 4a at the center and two positioning holes 4b near the bonding window 4a. The positioning holes 4b are on an imaginary straight line diagonally crossing the bonding window 4a.

Figure 3:
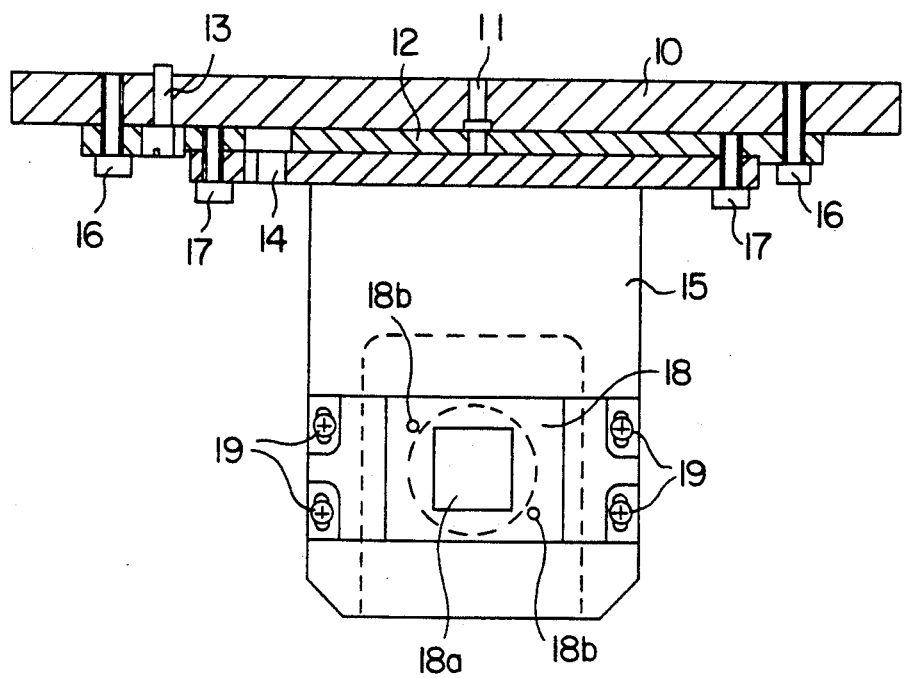
FIG. 3 shows a cross section taken along the line 3—3 in FIG. 2.

As seen in FIG. 3, a lower clamper raising-and-lowering arm ("lower clamper arm") 10 is provided with a pin 11. The lower clamper arm 10, like the upper clamper arm 1, is moved up and down by a driving means (not shown) while keeping its horizontal posture. A lower clamper adjusting plate 12 is rotatably supported on the pin 11. Furthermore, an eccentric pin 13 is rotatably provided in the lower clamper arm 10, and the lower clamper adjusting plate 12 is fitted over the large-diameter portion of the eccentric pin 13. Another eccentric pin 14 has a large-diameter portion, which is inserted into the lower clamper adjusting plate 12, and a small-diameter portion, which is inserted into a lower clamper holding plate 15.

The lower clamper adjusting plate 12 is fastened to the lower clamper arm 10 by screws 16, and the lower clamper holding plate 15 is fastened to the lower clamper adjusting plate 12 by screws 17.

A lower clamper 18 is fastened to the lower clamper holding plate 15 by screws 19. The lower clamper 18 has a bonding window 18a. The window 18a of the lower clamper 18 positionally corresponds to the bonding window 4a of the upper clamper 4. The lower clamper 18 also has positioning holes 18b at positions that correspond to the positioning holes 4b of the upper clamper 4.

Figure 4:
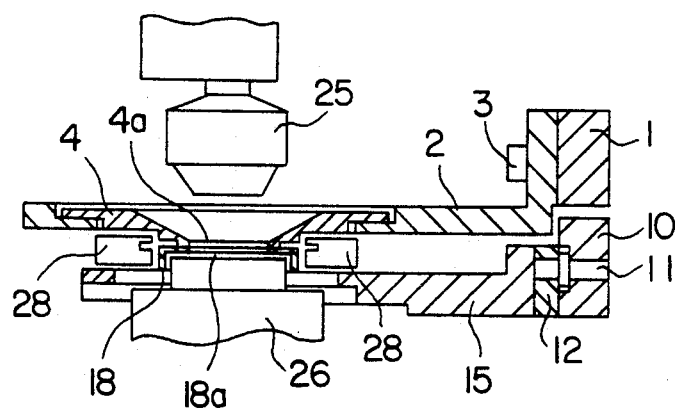
FIG. 4 shows a cross section taken along the line 4—4 in FIG. 1.

As seen in FIG. 4, a bonding tool 25 which is movable vertically and horizontally by a driving means (not shown) is positioned above the bonding window 4a of the upper clamper 4. A bonding stage 26 which is driven vertically and in the theta ($\theta$) direction is installed beneath the bonding window 18a of the lower clamper 18. A pellet (not shown) will be placed on the upper surface of the bonding stage 26 when bonding is performed. Furthermore, tape feeding rails 28 and 29 are installed on both sides of the upper clamper 4 and lower clamper 18 to guide a tab tape 27 (see FIG. 1) to the bonding windows 4a and 18a between the upper clamper 4 and the lower clamper 18.

The operation will be described below.

First, the lower clamper holding plate 15 is adjusted in the following manner: the screws 16 are loosened and the eccentric pin 13 is rotated so that the inclination of the lower clamper adjusting plate 12 and the lower clamper holding plate 15 are adjusted. In addition, the screws 17 are loosened and the eccentric pin 14 is rotated so that the position of the lower clamper 18 in the horizontal direction is adjusted. Once these adjustments are made, no further adjustment is necessary.

Figure 5:
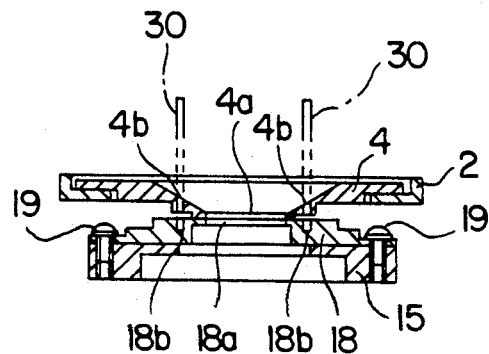
FIG. 5 shows a cross section taken along the line 5—5 in FIG. 1.

Next, the positional adjustment of the upper clamper 4 and the lower clamper 18 will be described:

First, the tab tape 27 is positioned in a bonding position (which is beneath the window 4a and 18a). After the screws 5 are loosened, the bonding window 4a of the upper clamper 4 is aligned visually with a bonding portion of the tab tape 27. Then, the screws 5 are tightened back. Next, the screws 19 are loosened, and then positioning pins 30 are inserted into the positioning holes 4b of the upper clamper 4 as shown in FIG. 5. The lower clamper 18 is then moved so that the positioning holes 18b of the lower clamper 18 are aligned with the positioning pins 30, and the positioning pins 30 are inserted into the positioning holes 18b of the lower clamper 18.

The upper clamper 4 and the lower clamper 18 are thus positioned via the positioning pins 30, and the screws 19 are tightened, and then the positioning pins 30 are removed.

The positional adjustment of the upper and lower clampers is performed each time the upper clamper 4 and lower clamper 18 are replaced due to change in the type of tab tape used for different bonding.

The operation of the tape feeding apparatus will be described below.

With the upper clamper 4 and the lower clamper 18 separated from each other, i. e., with the upper clamper 4 raised and the lower clamper 18 lowered, a feeding of the tab tape 27 is performed.

When leads provided on the tab tape 27 are positioned in the area of the bonding windows 4a and 18a, and the pellet placed on the bonding stage 26 is aligned with the leads of the tab tape 27, the lower clamper arm 10 is raised so that the lower clamper 18 is moved up to the feeding level of the tab tape 27. Then, the upper clamper arm 1 is lowered so that the upper clamper 4 presses the tab tape 27 against the lower clamper 18. Thus, the tab tape 27 is held by the upper clamper 4 and lower clamper 18.

Next, the bonding stage 26 is raised so that the pellet on the bonding stage 26 comes close to the leads of the tab tape 27, and the bonding tool 25 is lowered so that the leads of the tab tape 27 is pressed against the pellet. The pellet is thus bonded to the tab tape 27.

After the bonding is completed, the upper clamper arm 1 is raised. In other words, the upper clamper 4 is withdrawn from the tape feeding path. Then, the lower clamper arm 10 is lowered so that the lower clamper 18 is withdrawn from the tape feeding path. The tape is fed while the upper and lower clampers are withdrawn until the next bonding portion of the tape is positioned between the bonding windows 4a and 18a.

One bonding process is thus completed, and this operation is successively repeated to bond the pellets to the tab tape 27.

As seen from the above, positional alignment of the upper and lower clampers 4 and 18 is accomplished by inserting positioning pins 30 into the positioning holes 4b of the upper clamper 4 and then into the positioning holes 18b of the lower clamper 18. Accordingly, the two clampers 4 and 18 can easily be aligned, and there is no positional shift of the lower clamper 18 each time the screws 19 are tightened.

In the embodiment described above, both the upper clamper 4 and the lower clamper 18 are raised and lowered. However, the present invention is applicable to tape clamping apparatuses in which only one of the two clampers is moved up and down. Furthermore, in the embodiment described above, the bonding window 4a of the upper clamper 4 is positionally aligned with the bonding portion of the tab tape 27 beforehand, after which the lower clamper 18 is aligned with the upper clamper 4. However, it is possible to align the bonding window 18a of the lower clamper 18 with the bonding portion of the tab tape 27 beforehand, and then to align the upper clamper 4 with the lower clamper 18. In such a case, the positioning pins 30 are inserted into the positioning holes 4b of the upper clamper 4 with the screws 5 of the upper clamper 4 loosened, the upper clamper 4 is then moved so that the positioning pins 30 are aligned with the positioning holes 18b of the lower clamper 18, and then the positioning pins 30 are inserted into the positioning holes 18b of the lower clamper 18. The screws 5 are tightened back afterward.

In the present invention, respective positioning holes are formed at vertically corresponding positions in the upper and lower clampers. Accordingly, the upper and lower clampers are positionally aligned by inserting positioning pins into the positioning holes of the upper clamper first and then into the positioning holes of the lower clamper. Thus, positional alignment of the upper and lower clampers is accomplished easily and with high precision, and the clampers do not shift position when the screws are tightened.

We claim:

1. A tape clamping mechanism for tape bonding machines in which a tape is held by means of an upper clamper and a lower clamper, comprising:

an upper clamper arm movable up and down;

an upper clamper plate mounted on said upper clamper arm via screws;

an upper clamper mounted on said upper clamper plate via screws, said upper clamper being provided with a bonding window at the center and a pair of positioning holes;

a lower clamper arm movable up and down beneath said upper clamper arm;

a lower clamper plate mounted on said lower clamper arm by screws;

a lower clamper mounted on said lower clamper plate via screws, said lower clamper being provided with a bonding window at the center and a pair of positioning holes, and said positioning holes of said lower clamper being positionally aligned with said positioning hole of said upper clamper by means of positioning pins inserted into said positioning holes of said upper and lower clampers.

2. A tape clamping mechanism according to claim 1 further comprising a bonding tool positioned above said bonding window in said upper clamper.

3. A tape bonding mechanism according to claim 1 further comprising tape feeding rails provided on both sides of said upper and lower clampers.

* * * * *

UNITED STATES PATENT AND TRADEMARK OFFICE
CERTIFICATE OF CORRECTION

PATENT NO. : 5,249,726

DATED : October 5, 1993

INVENTOR(S) : Koji Sato et al

It is certified that error appears in the above-identified patent and that said Letters Patent is hereby corrected as shown below:

TITLE PAGE

Item [75] Inventors:   Change "Koji Sato, Fussa, Japan" to --Koji Sato; Tetsuya Kobaru, both of Tokyo, Japan--

Signed and Sealed this

Twenty-ninth Day of March, 1994

Attest:

BRUCE LEHMAN

*Attesting Officer*    *Commissioner of Patents and Trademarks*